United States Patent
Florian et al.

(10) Patent No.: US 7,692,368 B2
(45) Date of Patent: Apr. 6, 2010

(54) MULTI-LAYERED COMPONENT AND METHOD FOR THE PRODUCTION THEREOF

(75) Inventors: Heinz Florian, Wildbach (AT); Sigrid Ragossnig, Friesach (AT); Steffen Riemer, Krottadorf (AT); Peter Sedlmaier, Ruden (AT)

(73) Assignee: EPCOS AG, Munich (DE)

( * ) Notice: Subject to any disclaimer, the term of this patent is extended or adjusted under 35 U.S.C. 154(b) by 26 days.

(21) Appl. No.: 11/573,229

(22) PCT Filed: Aug. 5, 2005

(86) PCT No.: PCT/DE2005/001389

§ 371 (c)(1),
(2), (4) Date: Oct. 9, 2007

(87) PCT Pub. No.: WO2006/012891

PCT Pub. Date: Feb. 9, 2006

(65) Prior Publication Data

US 2008/0030105 A1 Feb. 7, 2008

(30) Foreign Application Priority Data

Aug. 5, 2004 (DE) .................. 10 2004 038 103

(51) Int. Cl.
*H01L 41/08* (2006.01)
(52) U.S. Cl. ................... 310/363; 310/328
(58) Field of Classification Search .......... 310/328, 310/358, 363, 364, 365, 366; 252/62.9 PZ; 264/605, 272.11
See application file for complete search history.

(56) References Cited

U.S. PATENT DOCUMENTS

| | | | | |
|---|---|---|---|---|
| 4,523,121 A | * | 6/1985 | Takahashi et al. | 310/358 |
| 4,845,399 A | * | 7/1989 | Yasuda et al. | 310/366 |
| 5,073,740 A | * | 12/1991 | Jomura et al. | 310/366 |
| 6,700,311 B2 | | 3/2004 | Hammer et al. | |
| 2005/0236933 A1 | | 10/2005 | Florian et al. | |

FOREIGN PATENT DOCUMENTS

| | | |
|---|---|---|
| DE | 38 32 658 | 4/1989 |
| DE | 199 46 836 | 11/2000 |
| DE | 100 06 352 | 8/2001 |
| DE | 103 20 161 | 3/2004 |
| JP | 63-142875 | * 6/1988 |
| JP | 03-052211 | 3/1991 |

(Continued)

OTHER PUBLICATIONS

International Search Report for PCT/DE2005/001389.

(Continued)

*Primary Examiner*—Walter Benson
*Assistant Examiner*—Karen B Addison
(74) *Attorney, Agent, or Firm*—Fish & Richardson P.C.

(57) ABSTRACT

A multilayer component includes a ceramic base body and at least one internal electrode in the ceramic base body. The at least one internal electrode includes holes, and is made of a material having a liquidus temperature that differs from a sintering temperature of the ceramic base body. The ceramic base body is sinterable such that formation of holes in the at least one internal electrode occurs during sintering.

18 Claims, 2 Drawing Sheets

FOREIGN PATENT DOCUMENTS

| | | |
|---|---|---|
| JP | 04-142085 | 5/1992 |
| JP | 08-055753 | 2/1996 |
| JP | 2002-075774 | 3/2002 |
| JP | 2002-198250 | 7/2002 |
| JP | 2002-208533 | 7/2002 |
| WO | WO99/12865 | 3/1999 |

OTHER PUBLICATIONS

Written Opinion for PCT/DE2005/001389.

English translation of Written Opinion for PCT/DE2005/001389.

* cited by examiner

MULTI-LAYERED COMPONENT AND METHOD FOR THE PRODUCTION THEREOF

TECHNICAL FIELD

This patent application describes a multilayer component and a method for its fabrication.

BACKGROUND

Inherent mechanical stiffness of multilayer components plays a key role in applications of such multilayer components, such as piezoelectric actuators and ferroelectric actuators.

WO 99/12865 describes a piezoelectric ceramic materials that includes lead zirconate titanate. For lead zirconate titanate with a perovskite structure $A^{2+}B^{4+}O_3$, a desired stabilization of the materials is achieved through partial substitution with ferroelectrically active compounds. The sintering temperature of such components can thus be reduced.

SUMMARY

A multilayer component is described, which comprises the following features: a ceramic base body and at least one internal electrode arranged in the ceramic base body, with the internal electrode comprising a plurality of holes.

In the multilayer component, the stability of the internal electrode against trans-axial contraction is partially or completely reduced. Therefore, during an axial displacement of the multilayer component, a virtually discontinuity-free trans-axial contraction of the internal electrode is possible. A larger axial displacement path of the multilayer component is thus achievable for the same applied voltage.

The multilayer component can be sintered more compactly because an internal electrode with holes has a smaller mechanical resistance compared with the ceramic of the base body, which is subjected to shrinkage during the sintering. A higher sintering density is accompanied by improved electrical characteristics. A higher sintering density also allows a larger displacement path. For a piezoelectric actuator, this can be advantageous.

For the fabrication of a multilayer component, ceramic films may be prepared, on which internal electrode material, such as a paste, is printed. The films are stacked and then cut or first cut and then stacked. The multilayer component is then sintered.

A silver palladium mixture may be used as the internal electrode material. Silver may be present in a weight percentage of between 60 and 80% and palladium may be present in a weight percentage of between 20 and 40%. From this mixture, a paste is formed, which is printed on the ceramic films to be stacked. The component obtained in this way is sintered at a temperature between 1120 and 1220° C., e.g., at 1170° C., with the internal electrode material softening just enough during the sintering process to form a lattice-like structure.

An internal electrode material may be used whose liquidus temperature is slightly different from the sintering temperature of the ceramic base body, such that the ceramic base body is sintered and simultaneously the internal electrode forms several holes. As a result, small holes can be formed in the internal electrode layer. The electromagnetic field distribution of the internal electrode is more homogeneous the smaller the holes of the internal electrode are.

Alternatively, copper or a copper alloy can be used as the internal electrode material. The material is applied to the ceramic films as paste by screen printing. A screen that is used in the screen printing process may produce a print pattern for the internal electrode that has holes or discontinuities with diameters between 10 and 20 μm. After the films are stacked, the resulting component is sintered at a temperature between 1000° C. and 1100° C., such as 1050° C.

A multilayer component is described in more detail below with reference to corresponding figures.

DETAILED DESCRIPTION

A method is described for varying a stability of a multilayer component for a specified component geometry, a given ceramic, and an internal electrode material.

For test purposes, the stability of multilayer actuators was measured, for example, on a force or displacement test assembly. The integral component stiffness value resulting from the measurement was attributed one to one to the elasticity of the ceramic. In other words, a higher stiffness value indicates a harder ceramic according to whether the ceramic was doped with donators or acceptors. From this consideration, it was attempted to set the modulus of elasticity of the multilayer piezoelectric actuator and thus the component stiffness primarily based on the composition of the ceramic (ceramic ingredients).

In general, the stiffness k of a multilayer component can be estimated by $$K = \frac{Y \cdot A}{l}$$

where Y is the modulus of elasticity, A is the cross-sectional area, and l is the length of the multilayer component or the active base body of the multilayer component.

Below, it is assumed that the multilayer component comprises a multilayer piezoelectric actuator, although the following description also applies to other multilayer components, such as multilayer capacitors or other multilayer components made from ceramics.

Figure 1:
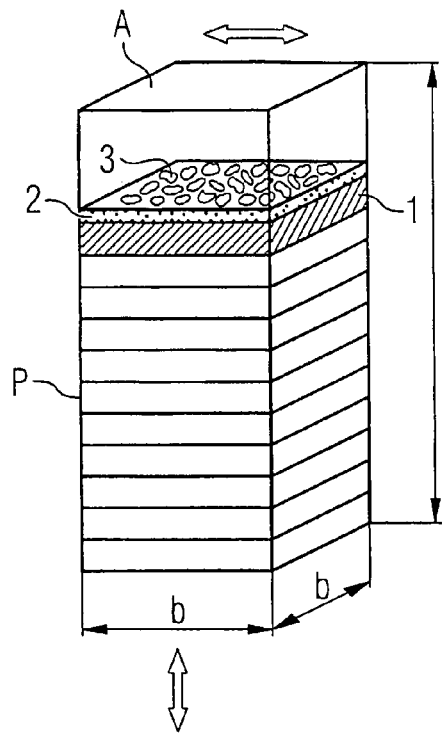
FIG. 1, a multilayer piezoelectric actuator with a piezoelectric ceramic layer bordering an internal electrode with holes, FIG. 2, an enlarged representation of the electrode with holes, FIG. 3, a two-dimensional photographic diagram of an internal electrode with holes, and FIG. 4, a graph for illustrating setting of the amount of discontinuity generated by the holes in the internal electrode, a voltage to be applied to the multilayer piezoelectric actuator, and a displacement path of the multilayer piezoelectric actuator.

The inherent stiffness of the multilayer piezoelectric actuator P shown in FIG. 1 is directly proportional to the modulus of elasticity Y and to the cross-sectional area A of the multilayer piezoelectric actuator P. The inherent stiffness of the multilayer piezoelectric actuator P shown in FIG. 1 is indirectly proportional to the length l of the multilayer piezoelectric actuator. The cross-sectional area A and the length l are dictated by application of the component and are thus fixed by the design of the multilayer piezoelectric actuator. Therefore, only variation of the modulus of elasticity Y remains in order to vary component stiffness. This involves an integral modulus of elasticity, which is dependent on the ceramic base body or the arrangement of the stacked ceramic layers 1 and on the one or more internal electrodes 2 and also on the internal electrode comprised of several internal electrodes 2. Thus, the integral component modulus of elasticity Y is defined by the ceramic material itself and by the material and the geometry of the internal electrode 2.

A property of piezoelectric/ferroelectric materials is that they undergo displacement when an electrical voltage is applied. With the displacement in one spatial direction, for example, the axial direction (bottom arrow of FIG. 1), a trans-axial contraction (top arrow of FIG. 1), or transverse contraction, occurs in spatial directions perpendicular to the direction of displacement. For multilayer piezoelectric actuators with continuous internal electrodes, the internal electrodes counteract this transverse contraction as mechanical counterparts and therefore reduce the transverse contraction (in comparison with a monolithic ceramic block without internal electrodes). By reducing the transverse contraction, multilayer piezoelectric actuators with continuous internal electrodes also reduce the displacement of the component.

To ease the transverse contraction, the internal electrodes 2 include holes. However, the holes need not pass completely through the internal electrodes. For example, the holes can be sizable recesses.

The two parameters of thickness d of the internal electrodes 2 and the amount of discontinuity 3D, that is, the number of holes 3 in the internal electrode per unit of surface area of the internal electrode, affect the integral modulus of elasticity of the multilayer piezoelectric actuator. Thus, stiffness of the multilayer piezoelectric actuator can be varied for a given geometry. In a profile cross sectional view, the amount of discontinuity 3D corresponds to electrode material-free areas within the internal electrode. To modify the component stiffness, two parameters may be varied: the thickness d of the internal electrode 2 and the amount of discontinuity 3D of the internal electrode.

The thickness of the internal electrodes may be kept as small as possible in order to use smaller quantities of electrode material and thus lower costs, and to achieve a high sintering density of the multilayer component. The multilayer piezoelectric actuator may be constructed so that its internal electrodes are connected to an electrically conductive contact layer in order to create the electrical connection to a voltage and current source.

Figure 2:
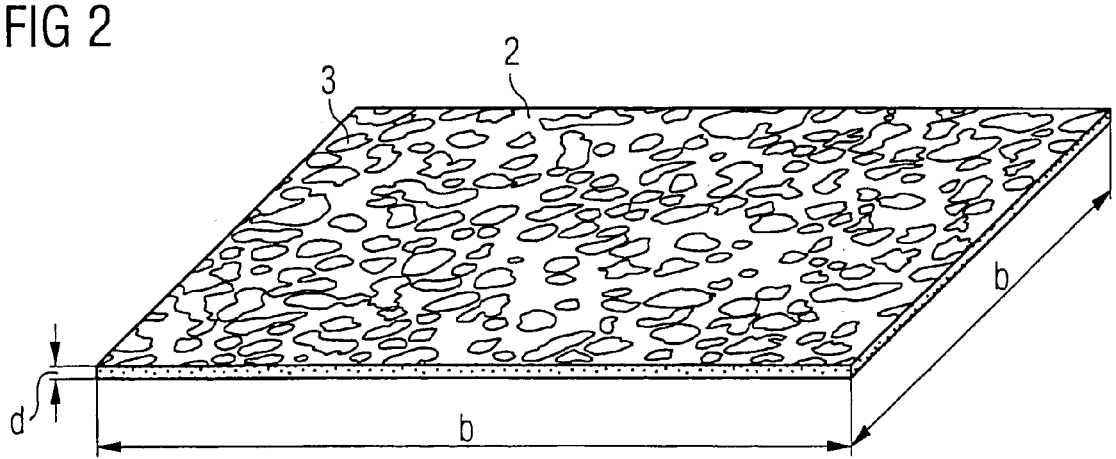

FIG. 2 illustrates the structure of an internal electrode 2. The white circles represent the holes 3. The amount of discontinuity 3D can be expressed in the following way as a formula:

$$3D = \frac{\sum_{i=1}^{N} AL_i \, [m^2]}{b^2 \, [m^2]}$$

where AL is the area of a hole or average area of a hole (in square meters), N is the number of holes, and b is the length of one side of the internal electrode. The amount of discontinuity is specified in terms of percentage.

Figure 3:
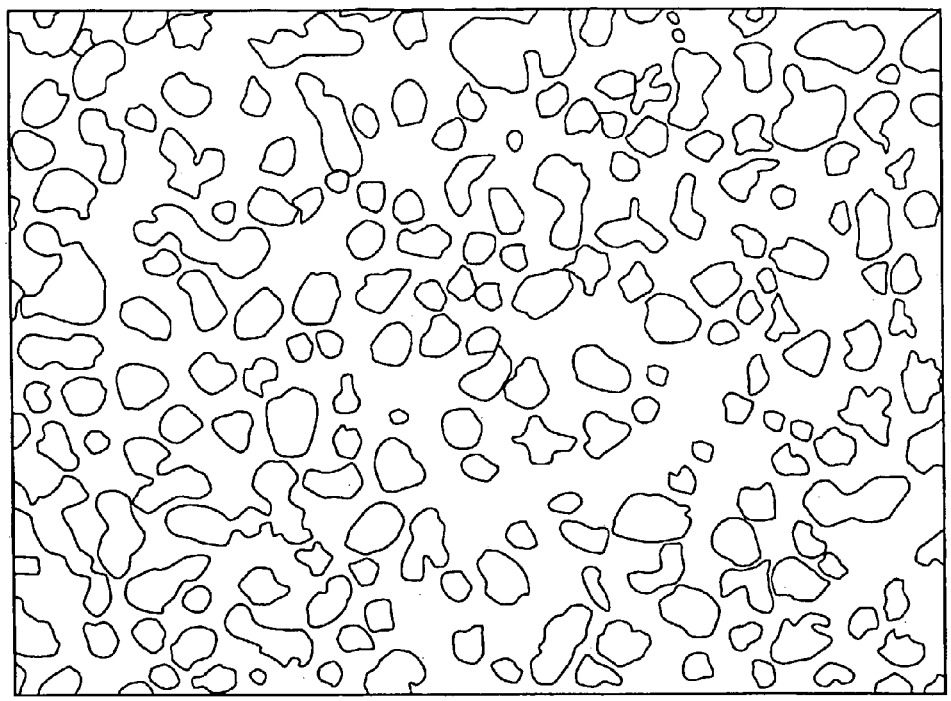

An internal electrode 2 with holes can be fabricated with suitable thermal processing control of the maximum sintering temperature relative to the liquidus temperature of the internal electrode material. The smaller the temperature difference is between the liquidus temperature of the internal electrode material and the maximum sintering temperature of the multilayer piezoelectric actuator, the more the internal electrode contracts, so that a perforated structure of the internal electrode according to FIG. 2 or 3 is produced during the sintering.

To fabricate an electric component with an internal electrode 2 with holes, films are prepared that contain ceramic material with piezoelectric characteristics, for example, lead zirconate titanate. However, piezoelectrically active ceramic material with a different composition, for example, a mixture made from lead zirconate titanate and lead nickel niobate, as well as a material which contains no lead, for example, sodium potassium niobate, can also be used.

To fabricate the internal electrodes, the films are printed by a screen-printing process with a paste containing a mixture made from silver and palladium in a ratio of, e.g., between 60 and 95 wt % silver and 5 to 40 wt % palladium. In particular, a ratio of 70 to 30 wt % of the respective materials leads to good results. With reference to a change in these weight percentages, it is possible to modify the processing temperature necessary for the fabrication of the electrical component, in order to form and adjust the lattice-like structure of the internal electrode 2 and to simultaneously achieve a sufficient sintering compaction of the ceramic for different ceramic materials with different sintering temperatures.

According to one embodiment, a paste prepared for screen printing on the ceramic films contains copper or a copper alloy. The screen is coated with a film, such that a print pattern is produced. The copper layer has circular discontinuities or holes, each with a diameter of approximately 10-20 µm.

The films printed with the silver palladium paste or with the copper or copper alloy paste are stacked and pressed together such that a stack corresponding to the function of the electrical component is produced.

After the organic bonding agent contained in the film and in the metal paste is burned off the component, which contains the mixture made from silver and palladium as an internal electrode, it is heated to a temperature of 1170° and kept at this temperature for two hours. This temperature is below the mixture ratio-dependent liquidus temperature of the silver palladium mixture, which is 1228° C. for a mixture ratio of 70% silver and 30% palladium. In this way, the ceramic is sintered, with the desired lattice structure formed in the internal electrode.

The component, which contains copper or copper alloy as the internal electrode, is heated to 1050° C. after the organic bonding agent is burned off, is kept at this temperature for two hours, and is sintered during this time. The lattice-like structure of the copper electrode is realized according to the manner of printing with a suitable screen.

FIG. 3 shows an REM image of a lattice-like internal electrode formed by the thermal process control.

The number of holes 3 to be expected during the sintering and their total area can be determined through empirical values from test results, with the formation of the holes being influenced by the temperature and the pressure during sintering as well as by the material of the internal electrode.

Figure 4:
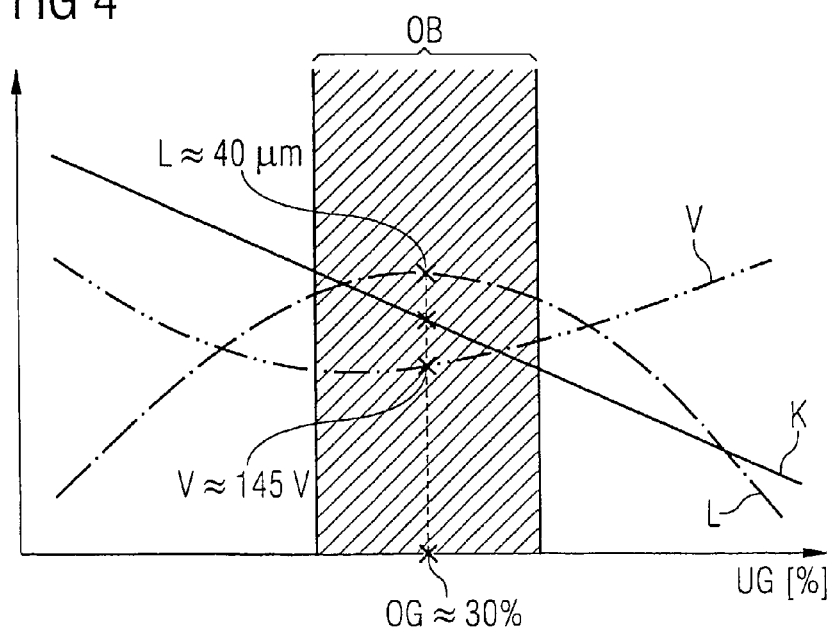

FIG. 4 shows a curve K, which shows the change of stiffness of the internal electrode as a function of the amount of discontinuity UG. Curve V shows voltages that are applied to the multilayer piezoelectric actuator in order to achieve a certain displacement path L of the multi-path piezoelectric actuator. The curve L shows different displacement paths, which are achieved with a constant voltage. The form of the curves L and V is also dependent on the amount of discontinuity of the internal electrode or on its stiffness k. Because the curves V, K, and L all concern different physical parameters, the left axis of the graphic is not labeled with characterizing units. The internal electrode may have an amount of discontinuity within the optimum range OB specified in FIG. 4, because here the lowest point of the curve V, that is a low voltage, corresponds to the highest point of the curve L, that is a large displacement path. It turns out that an amount of discontinuity UG of ca. 30% is sufficient (marked qualitatively on the bottom-most horizontal axis with an x) to achieve a maximum displacement path of 40 µm of the multilayer piezoelectric actuator at a minimum voltage of 145V.

The diameters of the circular holes of the internal electrode may be around 10 µm to 15 µm and/or the areas of non-circular holes may be around 50 to 90 µm². These relatively small sizes prevent undesired and interfering electric fields from forming at the holes. With this measure, the electric field can be considered to be homogeneous over the entire internal electrode. For such small holes, it is advantageous to form the holes during the sintering after the fabrication process, because such small holes are difficult to achieve for each screen printing process.

The sintering density of the ceramic base body or its dielectric or ceramic layers is connected to the geometric structure of the internal electrode. If the internal electrodes are continuous, these generate a greater resistance relative to the tendency of the ceramic base body to shrink during the sintering. In contrast, internal electrodes with holes tend to allow the fabrication of multilayer components with higher sintering densities, because the internal electrodes generate a smaller resistance relative to the shrinking of the ceramic base body. Higher sintering densities have the advantage that greater grain growth accompanies the elimination of pores or the reduction of free grain surfaces of the ceramic material, with the goal, in general, of reducing the surface and grain limiting energy leading to a reduction of the total free enthalpy of the sintering body. The electrical characteristics of the sintered multilayer piezoelectric actuator are thus improved, because, for example, a more homogeneous electromagnetic field distribution and a simpler and predictable displacement behavior of the multilayer piezoelectric actuator are guaranteed. A higher sintering density is therefore also especially interesting not only for multilayer piezoelectric actuators, but also, for example, for multilayer capacitors.

What is claimed is:

1. A multilayer component comprising:
    a base body comprising ceramic;
    at least one internal electrode in the base body, wherein the at least one internal electrode comprises holes;
    wherein the at least one internal electrode comprises a material having a liquidus temperature that differs from a sintering temperature of the base body; and
    wherein a difference between the liquidus temperature and the sintering temperature supports formation of the holes in the at least one internal electrode.

2. The multilayer component of claim 1, wherein the at least one internal electrode is flexible during transverse contraction of the multilayer component.

3. The multilayer component of claim 1, wherein the multilayer component comprises a multilayer piezoelectric actuator.

4. The multilayer component of claim 1, wherein the base body comprises several internal electrodes.

5. The multilayer component of claim 4, wherein the internal electrodes each comprises a silver palladium mixture, the silver palladium mixture comprising about 70% silver by weight and about 30% palladium by weight.

6. The multilayer component of claim 1, wherein the at least one internal electrode comprises a silver palladium mixture, the silver palladium mixture comprising 60% to 95% silver by weight and 5% to 40% palladium by weight.

7. The multilayer component of claim 1, wherein the liquidus temperature exceeds the sintering temperature.

8. The multilayer component of claim 1, wherein a temperature difference between the liquidus temperature and the sintering temperatures corresponds to a size of holes in the internal electrode.

9. The multilayer component of claim 1, wherein the holes comprise at least 30% of an entire surface area of the at least one internal electrode.

10. A method of forming a multilayer component comprised of a base body comprising ceramic and at least one internal electrode inside the base body, the method comprising:
    sintering the base body such that holes form in the at least one internal electrode during sintering, wherein the at least one internal electrode comprises a material having a liquidus temperature that differs from a sintering temperature of the base body, and wherein a difference between the liquidus temperature and the sintering temperature supports formation of the holes.

11. The method of claim 10, wherein the material comprises a silver palladium mixture, wherein the silver palladium mixture comprises 60% to 80% silver by weight and 20% to 40% palladium by weight; and
    wherein the multilayer component is sintered at a temperature between 1178° C. and 1278° C.

12. The method of claim 10, wherein the multilayer component comprises a multilayer piezoelectric actuator.

13. The method of claim 10, wherein the liquidus temperature exceeds the sintering temperature.

14. The method of claim 10, wherein a temperature difference between the liquidus temperature and the sintering temperatures corresponds to a size of holes in the at least one internal electrode.

15. The method of claim 10, wherein the at least one internal electrode comprises plural internal electrodes;
    wherein the plural internal electrodes each comprises a material having a liquidus temperature that differs from a sintering temperature of the base body; and
    wherein the base body is sinterable such that formation of holes in the internal electrodes occurs during sintering.

16. A method of forming a multilayer component comprising a base body comprising ceramic and at least one internal electrode in the base body, the method comprising:
    applying, to ceramic film, a material for the at least one internal electrode, wherein the material is applied via screen printing, and wherein a screen used for the screen printing produces holes in the at least one internal electrode;
    wherein the holes comprise at least 30% of an entire surface area of the at least one internal electrode.

17. The method of claim 16, wherein the material comprises copper or a copper alloy; and
    wherein the method further comprises sintering the multilayer component at a temperature between 1000° C. and 1100° C.

18. The method of claim 16, wherein the material comprises copper or a copper alloy.

* * * * *